(12) United States Patent
Mathieu

(10) Patent No.: US 6,580,100 B2
(45) Date of Patent: Jun. 17, 2003

(54) VOLTAGE-CONTROLLED VERTICAL BIDIRECTIONAL MONOLITHIC SWITCH

(75) Inventor: Roy Mathieu, Joue les Tours (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/246,918

(22) Filed: Sep. 19, 2002

(65) Prior Publication Data

US 2003/0057480 A1 Mar. 27, 2003

(30) Foreign Application Priority Data

Sep. 21, 2001 (FR) ............................................. 01 12197

(51) Int. Cl.[7] ........................ H01L 29/74; H01L 31/111
(52) U.S. Cl. .................. 257/124; 257/125; 257/126; 257/128; 257/133; 257/153; 257/335; 257/337; 257/341
(58) Field of Search .................. 257/119, 120, 257/124, 125, 126, 128, 133, 137, 153, 329, 335, 337, 341

(56) References Cited

U.S. PATENT DOCUMENTS 3,982,268 A    9/1976  Anthony et al.
4,816,892 A  * 3/1989  Temple ........................ 257/137
5,040,042 A  * 8/1991  Bauer et al. ................. 257/124
5,144,401 A  * 9/1992  Ogura et al. ................. 257/138
5,608,235 A    3/1997  Pezzani
5,608,237 A  * 3/1997  Aizawa et al. ............... 257/132
6,031,254 A  * 2/2000  Quoirin ....................... 257/155

FOREIGN PATENT DOCUMENTS

EP    0 111 804 A1   6/1984
FR    2 787 637 A1   6/2000

OTHER PUBLICATIONS

French Preliminary Search Report from French patent application No. 0112197, filed Sep. 21, 2001.

* cited by examiner

Primary Examiner—Ngân V. Ngô
(74) Attorney, Agent, or Firm—Wolf, Greenfield & Sacks, P.C.; James H. Morris

(57) ABSTRACT

A vertical voltage-controlled bidirectional monolithic switch formed between the upper and lower surfaces of a semiconductor substrate surrounded with a peripheral wall, including: a first multiple-cell vertical IGBT transistor extending between a cathode formed on the upper surface side and an anode formed on the lower surface side; and a second multiple-cell vertical IGBT transistor extending between a cathode formed on the lower surface side and an anode formed on the upper surface side, in which the cells of each transistor are arranged so that portions of the cells of a transistor are active upon operation of the other transistor.

9 Claims, 3 Drawing Sheets

VOLTAGE-CONTROLLED VERTICAL BIDIRECTIONAL MONOLITHIC SWITCH

BACKGROUND OF THE INVENTION

1. Field of the Invention

The present invention relates to voltage-controlled bidirectional vertical components and more specifically to voltage-controlled bidirectional vertical switches for medium-power applications enabling, for example, switching of loads connected to the mains, such as electrodomestic appliances.

2. Discussion of the Related Art

FIG. 1 is a very simplified cross-section view of a voltage-controlled vertical bidirectional switch formed from two vertical transistors of IGBT type (isolated gate bipolar transistor). It should be clear, as usual in the representation of semiconductor components, that the drawing is not to scale.

Switch 10 includes two vertical IGBT transistors 11A, 11B. Each transistor is comprised of a lightly-doped N-type substrate 13A, 13B delimited by a P-type isolating wall 14A, 14B. The lower surface of substrate 13A, 13B is uniformly coated with a P-type layer 15A, 15B.

On the upper surface side of substrate 13A, 13B is arranged a cell network 16A, 16B. For clarity, only two cells 16A, 16B are shown for each transistor 11A, 11B. Each cell 16A, 16B is comprised of a well 17A, 17B including a heavily-doped P-type central region 18A, 18B and a more lightly doped P-type peripheral region. A heavily-doped N-type ring 19A, 19B is formed in well 17A, 17B. The portion of well 17A, 17B outside of ring 19A, 19B is covered with an isolated gate 20A, 20B. Each transistor 11A, 11B also includes a P-type ring 21A, 21B, which surrounds cell network 16A, 16B. A peripheral heavily-doped N-type channel stop ring 22A, 22B is located at the periphery of transistor 11A, 11B.

A cathode metallization M1A, M1B contacts central region 18A, 18B of well 17A, 17B and N-type ring 19A, 19B of each cell 16A, 16B, as well as P-type ring 21A, 21B. An anode metallization M2A, M2B covers P-type layer 15A, 15B. A metal ring M3A, M3B is connected to peripheral channel stop ring 22A, 22B to make it equipotential. Similarly, a metal ring M4A, M4B is connected to isolating wall 14A, 14B to make it equipotential.

The terminals associated with isolated gates 20A, 20B of each transistor 11A, 11B are respectively designated with references G1, G2.

The lower surface of transistor 11A, located on the left-hand side of FIG. 1, directly rests on a radiator 23. The lower surface of transistor 11B, located to the right of FIG. 1, rests on radiator 23 with an interposed insulator 24.

The vertical bidirectional switch is obtained by connecting the two vertical IGBT transistors 11A, 11B as follows. Metallization M1A of transistor 11A, located to the left of FIG. 1, is connected by an electric connector 28 to the anode, formed by metallization M2B, of transistor 11B located to the right of FIG. 1. The cathode formed by metallization M1B of this latter transistor 11B is connected by an electric connector 29 to radiator 23. The two IGBT transistors 11A, 11B are thus connected in antiparallel. The main terminals of bidirectional switch 10 correspond to radiator 23 and to metallization M1A. According to the voltages on gates G1, G2, one or the other of the two transistors, or none of them, can be turned on. A voltage-controlled bidirectional switch is thus obtained.

The above voltage-controlled bidirectional switch has the disadvantage of not being monolithic. Conversely, it includes two transistors formed on separate chips. It thus has a relatively significant bulk and requires use of wirings to connect the two transistors. Further, one of the transistors is laid on the radiator via an insulator. It is often difficult to obtain an insulator both ensuring a good electric insulation between the transistor and the radiator and a satisfactory heat exchange between the two elements.

SUMMARY OF THE INVENTION

The present invention aims at monolithically forming a voltage-controlled bidirectional switch.

To achieve this and other objects, the present invention provides a vertical voltage-controlled bidirectional monolithic switch formed between the upper and lower surfaces of a semiconductor substrate surrounded with a peripheral wall, including a first multiple-cell vertical IGBT transistor extending between a cathode formed on the upper surface side and an anode formed on the lower surface side; and a second multiple-cell vertical IGBT transistor extending between a cathode formed on the lower surface side and an anode formed on the upper surface side, in which the cells of each transistor are arranged so that portions of the cells of a transistor are active upon operation of the other transistor.

The present invention also provides a vertical voltage-controlled bidirectional monolithic switch formed in a substrate of a first conductivity type surrounded with a peripheral wall of a second conductivity type, including a network of upper cells, formed on the upper surface side of the substrate, each upper cell being formed of a ring of the first conductivity type formed in a well of a second conductivity type, the well region outside of the ring forming a channel ring covered with an upper isolated gate; an upper metallization, forming a first main electrode, connected to the central region of the well and to the ring of each upper cell; a network of lower cells similar to the upper cells, formed on the lower surface side of the substrate, opposite to the network of upper cells; and a lower metallization forming a second main electrode, connected to the central region of the well and to the ring of each lower cell.

According to an embodiment of the present invention, the lower isolated gate is connected to a sink which crosses a region of the substrate from the lower surface to the upper surface, the sink being connected to a gate contact formed on the upper surface side.

According to an embodiment of the present invention, the lower isolated gate is connected to the sink by a metallization isolated from the lower metallization.

According to an embodiment of the present invention, the lower metallization covers the entire lower surface.

According to an embodiment of the present invention, the lower metallization is connected to the peripheral wall.

According to an embodiment of the present invention, the substrate region crossed by the sink is isolated from the substrate regions where the networks of upper and lower cells are formed by the peripheral wall which extends in an auxiliary wall of the second conductivity type.

According to an embodiment of the present invention, the peripheral wall extends on the lower surface side in a lower ring of the second conductivity type surrounding the network of lower cells.

According to an embodiment of the present invention, on the upper surface side, an upper ring of the second conductivity type surrounds the network of upper cells and is connected to the upper metallization.

According to an embodiment of the present invention, on the upper surface side, a heavily-doped channel stop ring of the first conductivity type surrounds the upper ring of the second conductivity type.

The foregoing objects, features and advantages of the present invention, will be discussed in detail in the following non-limiting description of specific embodiments in connection with the accompanying drawings.

DETAILED DESCRIPTION

Figure 1:
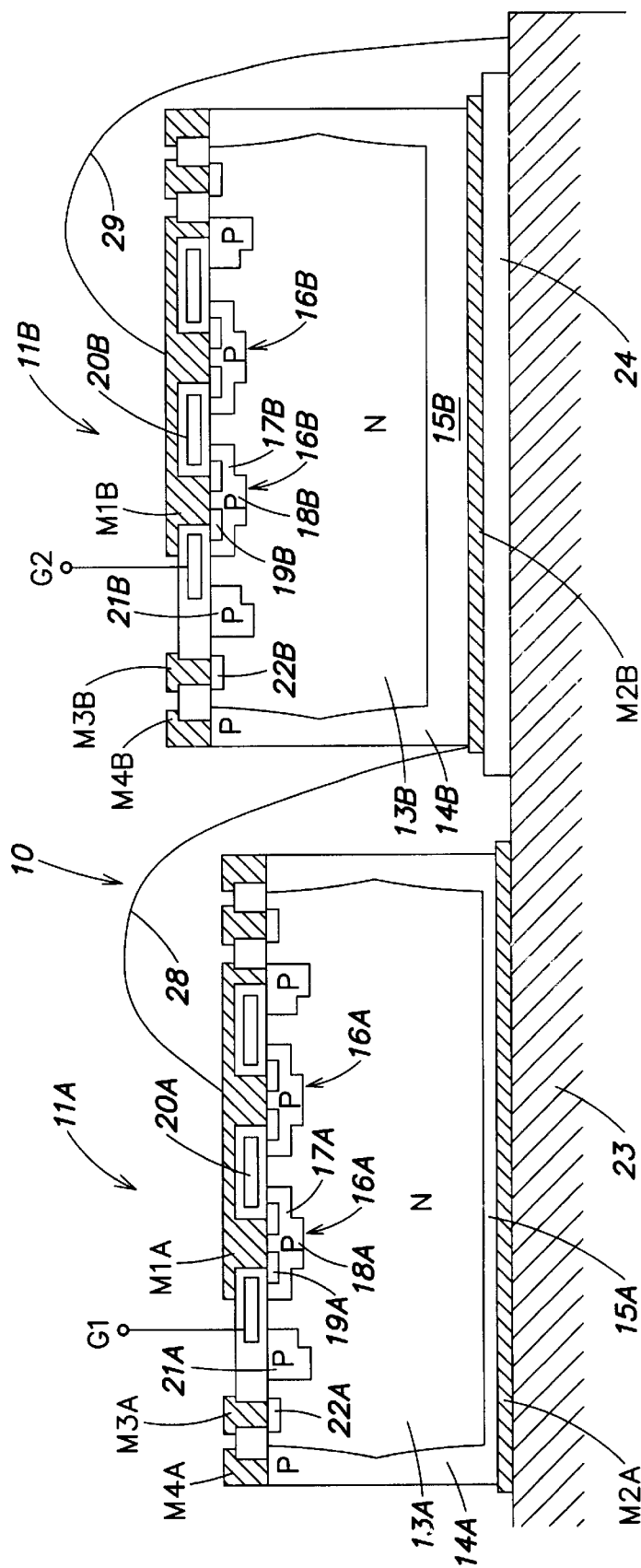
FIG. 1, previously described, shows a simplified cross-section view of a bidirectional switch according to prior art.
Figure 2:
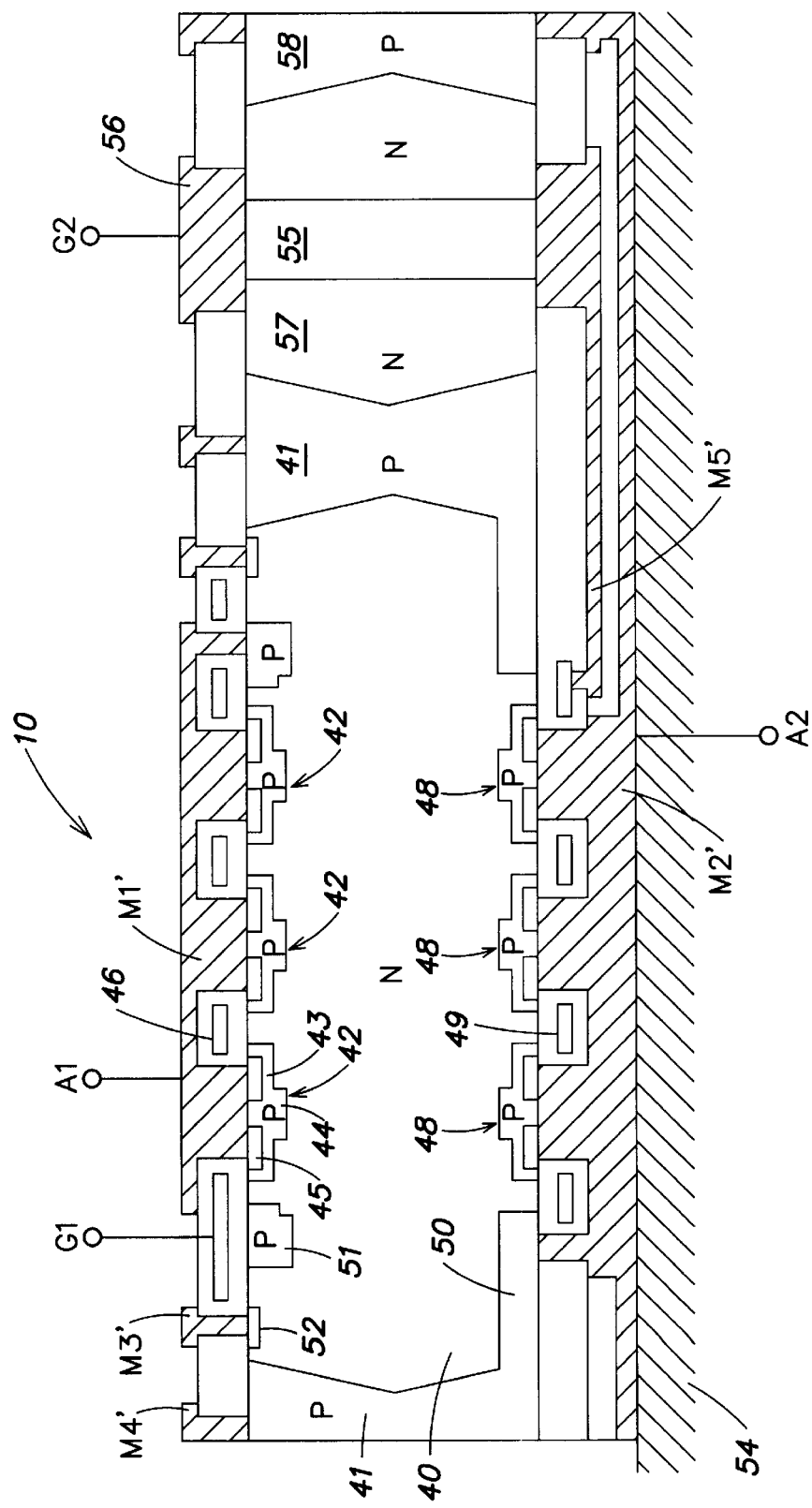
FIG. 2 shows a simplified cross-section view of a bidirectional switch according to the present invention.

As illustrated in FIG. 2, switch 10 is formed in an N-type substrate 40 surrounded with a P-type isolating wall 41. On the upper surface side of substrate 40 is formed a network of cells 42, only three cells being shown in FIG. 2. Each cell 42 includes a well 43 comprised of a heavily-doped P-type region 44 and of a more lightly doped P-type region. A heavily-doped N-type ring 45 is formed in well 43. The portion of well 43 outside of ring 45 is covered with an isolated gate 46.

On the lower surface side of substrate 40 is formed an similar arrangement of cells 48. The structure of cells 48 is identical to that of cells 42. On FIG. 2, only three lower cells 48 are shown. A lower isolated gate 49 covers the well portion outside of the ring of each lower cell 48.

Wall 41 includes a ring-shaped extension 50 on the lower surface side of the substrate which surrounds the network of lower cells 48.

As in prior art, on the upper surface side, a P-type upper ring 51 having a lightly-doped external periphery surrounds the network of upper cells 42. A heavily-doped N-type channel stop ring 52 is arranged around upper P-type ring 51.

A metallization M1' contacts central region 44 of well 43 and the N-type ring 45 of each upper cell 42, as well as P-type ring 51. A metallization M2' contacts on the lower surface side the central region of the P-type well and the N-type ring of each lower cell 48. Metallization M2' covers the entire lower surface of substrate 40. It is further connected to peripheral wall 41.

A metal ring M3' in contact with channel stop ring 52 equalizes the voltage on channel stop ring 52. Similarly, a metal ring M4' in contact with peripheral wall 41 equalizes the voltage thereon to the level of the upper surface.

Metallization M2' is assembled on a conductive support 54, for example, a radiator, with which it is in electric contact.

Lower isolated gate 49 is connected by a metallization M5' to a conductive sink 55 which thoroughly crosses the monolithic circuit to reach the upper surface where a gate contact 56 is made. Sink 55 is formed in a portion 57 of the substrate which is isolated from the active switch portion by peripheral wall 41, which extends in a complementary isolating wall 58. Sink 55 may be formed by a standard through wall manufacturing method. Sink 55 may also correspond to a heavily-doped P-type area formed according to a so-called temperature gradient zone melting (TGZM) technique, to a wall formed from trenches or to a metal via. Gate terminals G1, G2 are respectively connected to isolated gate 46 and to gate contact 56.

Figure 3:
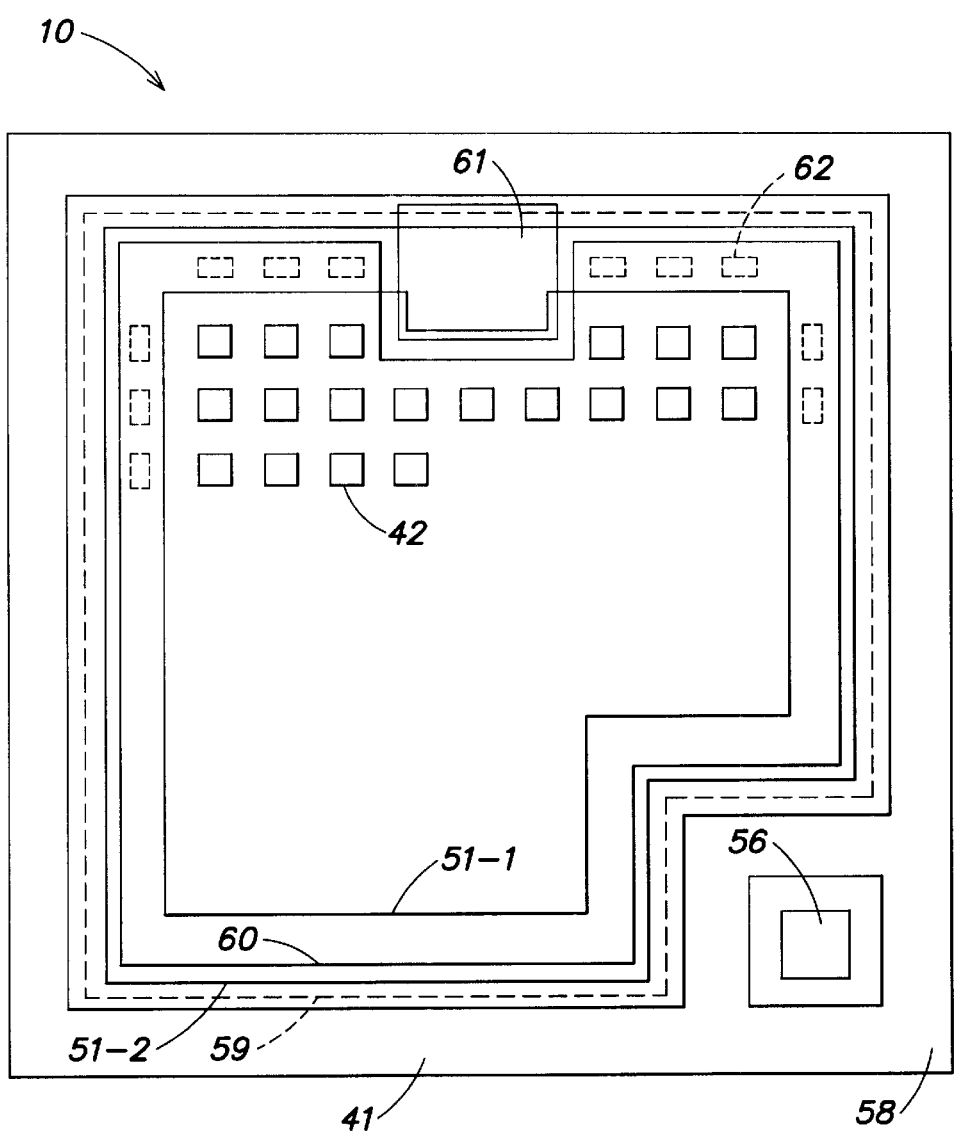
FIG. 3 shows a simplified top view of an embodiment of the bidirectional switch of FIG. 2.

FIG. 3 shows in a very simplified manner an example of distribution of the different elements located on the upper surface level of the monolithic circuit. Upper cells 42 are represented by simple squares. The limits of P-type ring 51 are shown with the lines bearing references 51-1 and 51-2. The limit of the upper isolated gate 46 is shown by a dotted line 59. The limit of metallization M1' is shown by line 60. Contact pad 56 of lower isolated gate 49 is shown to the bottom left of FIG. 3. A contact pad 61 of upper isolated gate 46 is shown to the top center of FIG. 3 by a square surface. The contacts between metallization M1' and P-type ring 51 are symbolized by rectangles in dotted lines 62. Contact pad 61 of upper gate 46 may include a ring portion, not shown, which surrounds upper cell network 42.

The operation of the bidirectional switch according to the present invention is the following.

The switch behaves as two IGBT-type transistors arranged in antiparallel.

Main terminals A1, A2 shown on FIG. 2 of the switch are taken on the one hand on metallization M1' and on conductive support 54. The switch is controlled by contact terminals G1, G2 of upper and lower gates 46 and 49.

As an example, when terminal A2 is positively biased with respect to terminal A1, when gate terminal G1 is controlled and when gate terminal G2 is not controlled, the current path from terminal A2 to terminal A1 schematically is the following. From metallization M2', the current crosses, for each lower cell 48, the forward junction between the heavily-doped P-type region and N-type substrate 40, then crosses, for each upper cell 42, the channel formed in the region of well 43 outside of ring 45 to join metallization M1'. The current can flow through upper cells 42, due to the application on gate terminal G1 of a control voltage enabling, in each upper cell 42, formation of a channel in the region of well 43 external to ring 45.

When terminal A1 is positively biased with respect to terminal A2, when gate terminal G2 is controlled and when gate terminal G1 is not controlled, the current path from terminal A1 to terminal A2 schematically is the following. From metallization M1', the current crosses, for each upper cell 42, the forward junction between the heavily-doped P-type region and N-type substrate 40, then crosses, for each lower cell 48, the channel formed in the region of well 43 external to ring 45, to join metallization M2'. The current can flow through lower cells 48, due to the application on gate terminal G2 of the control voltage which enables, in each lower cell 48, formation of a channel in the well region external to the ring.

A component which behaves as a voltage-controlled vertical bidirectional switch is thus obtained.

The switch according to the present invention is particularly well adapted to medium-power applications, for example, to withstand voltages on the order of 600 V, and currents ranging between 1 and 50 A. As an example, for currents on the order of 8 A, the monolithic circuit may have general dimensions of 3.6 millimeters by 4.2 millimeters. Wall 41, 58 surrounding sink 55 delimits a surface of approximately 200 µm by 200 µm. Each cell may have dimensions of 25 µm by 25 µm and may be spaced apart from the next cells by 25 µm.

Those skilled in the art should note that the off-state breakdown voltage of the switch according to the present invention is essentially defined by the junctions between the substrate and the cell wells. The doping of these wells will be optimized to reach the selected breakdown voltage while enabling satisfactory control of the channel regions of the cells.

The present invention has many advantages.

The two IGBT transistors forming the switch are integrated in a single monolithic component directly assembled on a support on the side of a metal layer which completely covers the lower surface of the monolithic component. The switch assembly is thus simplified as compared to prior art since the steps of attaching one of the transistors on an insulating layer as well as of forming various internal connections of the switch by electric wirings have been eliminated.

Further, in the general case where the support is a radiator, a good thermal exchange is obtained between the monolithic circuit and the radiator due to the lower metallization covering the entire lower surface of the monolithic circuit.

Further, the forming of cell networks on both surfaces of the monolithic circuit enables obtaining a component having its surface area approximately divided by two with respect to that of a switch of prior art.

Of course, the present invention is likely to have various alterations, modifications, and improvements which will readily occur to those skilled in the art. Thus, the conductivity types of the different elements forming the switch may be inverted. Further, the upper and lower cells have been shown to be perfectly opposite to one another. They may be shifted to optimize the path followed by the current.

Such alterations, modifications, and improvements are intended to be part of this disclosure, and are intended to be within the spirit and the scope of the present invention. Accordingly, the foregoing description is by way of example only and only as defined in the following claims and the equivalents is not intended to be limiting. The present invention is limited thereto.

What is claimed is:

1. A vertical voltage-controlled bidirectional monolithic switch formed between upper and lower surfaces of a semiconductor substrate surrounded with a peripheral wall, including:
   a first multiple-cell vertical IGBT transistor extending between a cathode formed on the upper surface side and an anode formed on the lower surface side, the isolated gate of the first IGBT transistor being formed on the upper surface side; and
   a second multiple-cell vertical IGBT transistor extending between a cathode formed on the lower surface side and an anode formed on the upper surface side, the isolated gate of the second IGBT transistor being formed on the lower surface side;
   in which the cells of each transistor are arranged so that portions of the cells of a transistor are active upon operation of the other transistor, wherein the isolated gate of the second IGBT transistor is connected to a sink which crosses a region of the substrate from the lower surface to the upper surface, the sink being connected to a gate contact formed on the upper surface side.

2. A vertical voltage-controlled bidirectional monolithic switch formed in a substrate of a first conductivity type surrounded with a peripheral wall of a second conductivity type, including:
   a network of upper cells, formed on the upper surface side of the substrate, each upper cell being formed of a ring of the first conductivity type formed in a well of a second conductivity type, the well region outside of the ring forming a channel ring covered with an upper isolated gate;
   an upper metallization, forming a first main electrode, connected to the central region of the well and to the ring of each upper cell;
   a network of lower cells similar to the upper cells, formed on the lower surface side of the substrate, opposite to the network of upper cells; and
   a lower metallization forming a second main electrode, connected to the central region of the well and to the ring of each lower cell,
   wherein the lower isolated gate is connected to a sink which crosses a region of the substrate from the lower surface to the upper surface, the sink being connected to a gate contact formed on the upper surface side.

3. The switch of claim 2, wherein the lower isolated gate is connected to the sink by a metallization isolated from the lower metallization.

4. The switch of claim 2, wherein the lower metallization covers the entire lower surface.

5. The switch of claim 2, wherein the lower metallization is connected to the peripheral wall.

6. The switch of claim 2, wherein the substrate region crossed by the sink is isolated from the substrate regions where the networks of upper and lower cells are formed by the peripheral wall which extends in an auxiliary wall of the second conductivity type.

7. The switch of claim 2, wherein the peripheral wall extends on the lower surface side in a lower ring of the second conductivity type surrounding the network of lower cells.

8. The switch of claim 2, including, on the upper surface side, an upper ring of the second conductivity type surrounding the network of upper cells and connected to the upper metallization.

9. The switch of claim 8, including, on the upper surface side, a heavily-doped channel stop ring of the first conductivity type surrounding the upper ring of the second conductivity type.

* * * * *

UNITED STATES PATENT AND TRADEMARK OFFICE
CERTIFICATE OF CORRECTION

PATENT NO. : 6,580,100 B2
DATED : June 17, 2003
INVENTOR(S) : Mathieu Roy

It is certified that error appears in the above-identified patent and that said Letters Patent is hereby corrected as shown below:

<u>Title page,</u>
Item [12], should read:
-- [12]  United States Patent
          Roy --
Item [75] should read:
-- [75]  Inventor:  Mathieu Roy, Joue les Tours (FR) --

Signed and Sealed this

Twenty-third Day of November, 2004

JON W. DUDAS
*Director of the United States Patent and Trademark Office*